United States Patent
Nelson et al.

(12)

(10) Patent No.: US 6,265,729 B1
(45) Date of Patent: Jul. 24, 2001

(54) METHOD FOR DETECTING AND CHARACTERIZING PLASMA-ETCH INDUCED DAMAGE IN AN INTEGRATED CIRCUIT

(75) Inventors: Mark Michael Nelson; Subhash Madhukar Deshmukh, both of Pocatello, ID (US)

(73) Assignee: American Microsystems, Inc., Pocatello, ID (US)

( * ) Notice: Subject to any disclaimer, the term of this patent is extended or adjusted under 35 U.S.C. 154(b) by 0 days.

(21) Appl. No.: 09/277,338

(22) Filed: Mar. 26, 1999

Related U.S. Application Data

(62) Division of application No. 08/950,000, filed on Oct. 14, 1997.

(51) Int. Cl.[7] ........................... H01L 23/58; H01L 29/76; H01L 29/94; H01L 31/062; H01L 31/113
(52) U.S. Cl. ................................. 257/48; 257/288; 438/18
(58) Field of Search ............................. 257/48, 288, 348; 438/17, 18

(56) References Cited

U.S. PATENT DOCUMENTS

| | | | |
|---|---|---|---|
| 4,434,401 | * 2/1984 | York | 324/766 |
| 4,542,340 | 9/1985 | Chakravarti . | |
| 5,032,786 | * 7/1991 | Kimura | 438/17 |
| 5,179,433 | 1/1993 | Misawa et al. . | |
| 5,596,207 | 1/1997 | Krishnan et al. . | |

OTHER PUBLICATIONS

Subhash R. Nariani et al. "Gate Antenna Structures for Monitoring Oxide Quality and Reliability", VLSI Technology, Inc.—Proc. IEEE 1995 Int. Conference on Microelectronic Test Structures, vol. 8, Mar. 1995, pp. 93–95.

Paul Aum et al. "Use of SPIDER for the Identification and Analysis of Process Induced Damage in 0.35 $\mu$m Transistors", SEMATECH,—Proc. IEEE 1995 Int. Conference on Microelectronic Test Structures, vol. 8, Mar. 1995, pp. 1–4.

Bill Verzi et al. "Automated Gated Diode Measurements for Device Characterization", Hewlett–Packard/SEMATECH—Proc. IEEE 1994 Int. Conference on Microelectronic Test Structures, vol. 7, Mar. 1994, pp. 141–146.

Y. Uraoka et al. "Evaluation Technique of Gate Oxide Damage", Semiconductor Research Center—Proc. IEEE Int. Conference on Microelectronic Test Structures, vol. 6, Mar. 1993, pp. 149–154.

\* cited by examiner

*Primary Examiner*—Olik Chaudhuri
*Assistant Examiner*—Howard Weiss
(74) *Attorney, Agent, or Firm*—Skjerven Morrill MacPherson LLP; Alex C. Chen

(57) ABSTRACT

Characterization of plasma-induced damage in semiconductor manufacturing has long been considered unimportant because the damage had no discernible effect on circuit performance. With increasing transistor counts on an integrated circuit, the damage-induced parasitics are becoming increasingly important. Electrical characterization of such effects provides a far more sensitive method for determining the extent of damage and the effectiveness of efforts to repair the damage. A measurement of diode leakage current through a plasma-etch effect test diode which is formed completely within an active device region, removed from field oxide regions quantifies the extent of damage created by a plasma and the effectiveness of a repair technique that may be applied to the process.

19 Claims, 3 Drawing Sheets

METHOD FOR DETECTING AND CHARACTERIZING PLASMA-ETCH INDUCED DAMAGE IN AN INTEGRATED CIRCUIT

The present application is a division of application Ser. No. 08/950,000, filed Oct. 14, 1997.

BACKGROUND OF THE INVENTION

1. Field of the Invention

The present invention relates to a semiconductor integrated circuit structure and semiconductor testing method thereof More specifically, the present invention relates to a test structure and testing method for quantifying damage resulting from plasma-etching during fabrication of semiconductor integrated circuits.

2. Description of the Related Art

The process of fabricating integrated circuits includes the deposition of multiple layers of semiconductor, dielectric, and conductive materials on a semiconductor wafer. Bach of the multiple layers is typically patterned and etched to form a useful pattern thereby creating and isolating active devices, capacitors, resistors, and the like. The patterning and etching further interconnects the active devices, capacitors, resistors, and the like to create an operational circuit. The material layers are commonly by chemical vapor deposited (CVD), growth, sputtering or evaporation. Etching is achieved by various wet etching and plasma etching processes. The deposition and etching steps are performed in a sequence wherein lower layers are covered by subsequently-deposited upper layers. The lower layers are therefore subjected to the physical effects that result from the deposition and etching steps for forming overlying structures. For example, an underlying layer is subjected to temperature changes inherent to deposition and annealing processes applied to upper layers. Furthermore, the etching of upper layers may damage or otherwise harmfully affect previously deposited, lower layers.

Plasma etching is a fabrication technique that is well known to cause damage to underlying structures. Plasma etching is any process using a plasma for generating reactive species that chemically etches material in direct proximity to the plasma. Plasma etching is known to cause damage to silicon substrate of an integrated circuit and also to other structures that are formed to produce operational circuits. For example, wafers that are etched by dry etch processes are typically subjected to contamination from multiple sources including polymeric residues from the etch process, deposition of nonvolatile contaminants from sputtering during the etch process, and particulate contamination. Polymeric residue contamination results from a halogen deficiency in halocarbon plasmas and may produce rough surfaces on etched films and underlayers, high contact resistance, and collection of corrosion-causing halogens.

What is needed is a technique for detecting and minimizing damage to the underlying layers of a semiconductor to improve reliability and performance of active devices such as MOS transistors.

Several methods of characterizing plasma-etch induced damage to silicon substrate and oxides have been employed. These methods include a determination of minority-carrier lifetime which is commonly called wafer tau($\tau$) surface photo-voltage measurements (SPV) for measuring minority carrier lifetime of the surface region of a semiconductor to detect damage to the semiconductor substrate material, thermal wave measurements for detecting changed reflectivity characteristics caused by damage, and standard diode leakage measurements. Other methods include breakdown measurements on blanket (unpatterned) wafers to detect damage to the oxide layer resulting from general exposure to the etchant, and electron microscopy (SEM/TEM) cross-section analysis to visually detect trenching. All methods are capable of measuring plasma-induced damage to some extent, but all have limitations including a limited sensitivity. Furthermore, the conventional test techniques supply only general damage estimates that are inadequate for evaluating advanced small-geometry processes due to an overall lack of sensitivity and a limited capability to resolve areas between closely-spaced devices. In addition, many of the techniques involve destructive testing and are therefore inadequate for testing production devices.

For example, breakdown measurements on an unpatterned wafer offer no insight into plasma-etch effects on actual active devices and the oxide layer weaknesses that are common to etched structures. Surface photo-voltage measurements permit an inference of damage to the silicon but do not specifically resolve damage at the edges of an etched structure. Electron microscopy is a destructive analysis that requires cross-sectioning of the integrated circuit so that only damage to the oxide located along the sampled cross-section is detected.

What is needed is a non-destructive test technique and test structure for characterizing plasma-induced damage that is simple, integrates easily and inexpensively into an integrated circuit process flow, and generates a highly sensitive characterization of damage.

SUMMARY

Characterization of plasma-induced damage in semiconductor manufacturing has long been considered unimportant when the damage had no discernible effect on circuit performance. With increasing transistor counts on an integrated circuit, the damage-induced parasitics are becoming increasingly important. Electrical characterization of such effects provides a far more sensitive method for determining the extent of damage and the effectiveness of efforts to repair the damage.

In accordance with an aspect of the present invention, a measurement of diode leakage current through a plasma-etch effect test diode which is formed completely within an active device region, removed from field oxide regions quantifies the extent of damage created by a plasma and the effectiveness of a repair technique that may be applied to the process.

In accordance with an embodiment of the present invention, an apparatus for detecting and characterizing plasma-etch induced damage in an integrated circuit includes a semiconductor substrate having a substrate conductivity, a silicon dioxide layer overlying the semiconductor substrate, and a diode having a conductivity opposite to the substrate conductivity doped into a diode region within the active device region of the semiconductor substrate. The silicon dioxide layer includes a thin silicon dioxide portion overlying an active device region of the semiconductor substrate and a thick field oxide layer in a field region bounding the active device region. The diode region is fully contained within the active device region and removed from the thick field oxide layer in the field regions In accordance with another embodiment of the present invention, a technique for detecting and characterizing plasma-etch induced damage in an integrated circuit includes forming a plasma-etch effect test diode in a semiconductor substrate and testing the plasma-etch effect test diode using a diode leakage test. The semiconductor substrate has a substrate conductivity and a silicon dioxide layer overlying the semiconductor substrate. The silicon dioxide layer has a thin silicon dioxide portion overlying an active device region of the semiconductor substrate and a thick field oxide layer in a field region. The plasma-etch effect test diode has a conductivity opposite to the substrate conductivity doped into a diode region within the active device region of the semiconductor substrate. The diode region is fully contained within the active device region and removed from the thick field oxide layer in the field region.

Many advantages are gained by the described integrated circuit test structure, corresponding fabrication method, and test procedure. Advantageously, the integrated circuit test structure, a plasma-etch effect test diode, is a simple device that is simple to fabricate and test. It is advantageous that the process steps for fabricating the plasma-etch effect test diode are similar to the process steps for fabricating devices on an operational integrated circuit so that test structures are formed with minimal mask and process adjustments. Furthermore, it is advantageous that the steps for fabricating the plasma-etch effect test diode are fully integrated into a standard CMOS process flow with few additional steps The plasma-etch effect test diode provides plasma-etch damage characterization that has been found to be much more sensitive than conventional techniques.

The described integrated circuit test structure, corresponding fabrication method, and test procedure is used to characterize any type of plasma processing that terminates on silicon. The described technique utilizes either N-type diodes or P-type diodes and theoretically is applicable to any diode type including liquid-crystal displays (LCDs) by applying the concept of using the exposed diode junction as a damage detection site.

BRIEF DESCRIPTION OF THE DRAWINGS

The features of the described embodiments believed to be novel are specifically set forth in the appended claims. However, embodiments of the invention relating to both structure and method of operation, may best be understood by referring to the following description and accompanying drawings.

DETAILED DESCRIPTION OF THE ILLUSTRATIVE EMBODIMENTS

Figure 1A:
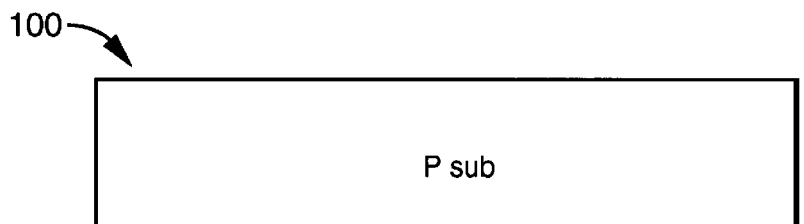
FIGS. 1A through 1D show schematic cross-sectional views of a portion of a semiconductor wafer including a plasma-etch effect test diode for performing an electrical diagnostic technique for silicon plasma-etch induced damage characterization.

Referring to FIG. 1A, a cross-sectional view of a semiconductor wafer 100 is shown in which a plasma-etch damage test structure is formed. In the illustrative embodiment, a plasma-etch test diode is formed in a lightly-doped P-type substrate 102 having a P-type impurity concentration of greater than approximately $10^{15}/cm^3$ and a substrate resistance in the range of 1–300 ohms. The starting material is typically a heavily-doped <100>-orientation silicon substrate semiconductor wafer 100 having a quality suitable for integrated circuit manufacture.

In an illustrative embodiment, a thin (5 $\mu$m to 10 $\mu$m) lightly-doped epitaxial layer is grown on the silicon substrate semiconductor wafer 100. In other embodiments, a plasma-etch damage test structure may be formed in bulk silicon wafers and other epitaxial substrates such as N-type epitaxial layers. The illustrative epitaxial layer is a P-type epitaxial surface layer with a <100>orientation and a resistivity of 12 ohm-cm. Either an n-epi-on-n$_+$or a p-epi-on-p$_+$ substrate may be used for the epitaxial layer. The p-epi-on-p$_+$substrate is more typically used due to a lesser sensitivity to process-induced defects. The silicon substrate and the epitaxial layer in combination form a lightly-doped P-substrate 100 at a processing surface of the silicon substrate semiconductor wafer 100.

Figure 1B:
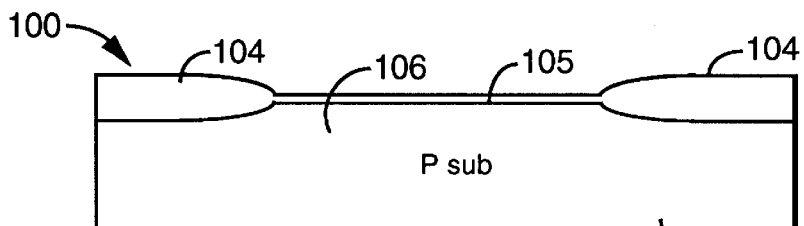

Referring to FIG. 1B, field oxide regions 104 are formed to provide isolation between semiconductor devices such as MOS transistors (not shown) and a plasma-etch damage test structure that is subsequently formed. The field oxide regions 104 are most typically formed for creating isolation in N-channel MOS and P-channel MOS transistor integrated circuits using a local oxidation of silicon (LOCOS) structure. Using the LOCOS structure, silicon dioxide ($SiO_2$) is selectively grown over field regions of the semiconductor wafer 100. The field oxide regions 104 and thin oxide film 105 are formed by covering active device regions 106 with a thin layer of silicon nitride (not shown). Transistors and the plasma-etch damage test structure are subsequently formed in the active device regions 106. The semiconductor wafer 100 with a bare silicon surface is cleaned and a 40–50 nm $SiO_2$ pad oxide or buffer oxide layer (not shown) is thermally grown to cushion the transition of stresses between the silicon substrate and the subsequently deposited nitride. A thin oxide film 105 is grown by thermal oxidation, typically to a thickness of approximately 250 Å to 300 Å.

A 100–200 nm thick layer of CVD silicon nitride is formed overlying the buffer oxide layer to serve as an oxidation mask for formation of the field oxide regions 104. Active device regions 106 are defined with a photolithographic step using a resist pattern to protect active regions and expose field regions. The nitride layer is dry etched and the buffer oxide layer wet or dry etched. Silicon in the field regions is selectively implanted with channel-stop dopant so that channel-stop regions are self-aligned to the field oxide regions 104.

Field oxide is thermally grown using a wet oxidation process at temperatures of approximately 1000° C. while the active device regions 106 are covered by the silicon nitride layer, preventing oxidation of the silicon beneath the silicon nitride. Resulting field oxide regions 104 have a thickness of 0.5 to 1.0 $\mu$m.

Figure 1C:
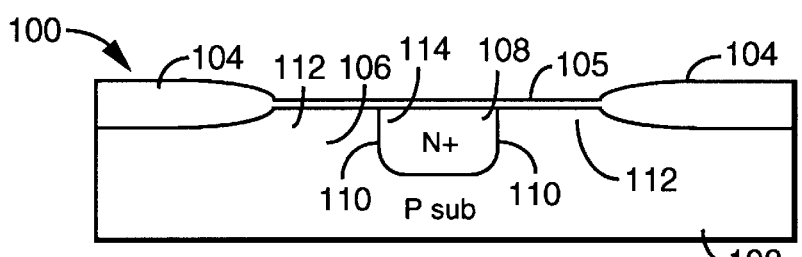
Figure 2:
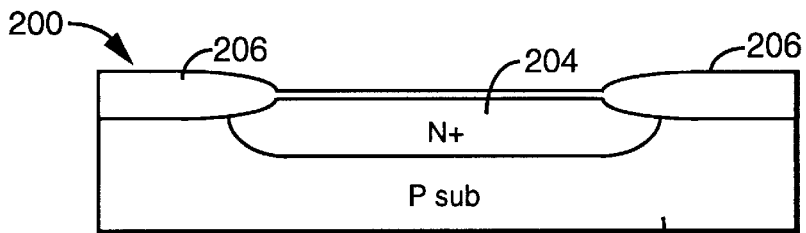
FIG. 2 is a schematic cross-sectional view of a portion of a semiconductor wafer including a test diode for performing silicon plasma-etch induced damage characterization with substantially lower sensitivity.

Referring to FIG. 1C, a plasma-etch effect test diode 108 is formed in the active device region 106 of the P-type substrate 102. A plasma-etch effect test diode 108 extends laterally only within the active device regions 106 and does not extend beneath the field oxide regions 104 so that the plasma-etch effect test diode 108 terminates within the region of the P-type substrate 102 that is affected by subsequent plasma etching. In contrast, a diode 204 shown in FIG. 2 that terminates beneath a field oxide region 206 extends to a region of substrate 202 that is protected from plasma-etch induced damage. The structure of the plasma-etch effect test diode 108 shown in FIG. 1C advantageously achieves a much higher sensitivity for detecting plasma-etched induced damage. The plasma-etch effect test diode 108 has lateral termination points 110 within the active device region 106 and are thus affected or damaged by subsequent plasma-etching steps performed generally in semiconductor processing. In general, the greater the area peripheral to the plasma-etch effect test diode 108 but still within the active device region 106, the greater the sensitivity for detecting plasma-etch damage. The larger the exposed peripheral edge of the plasma-etch effect test diode 108, the greater the sensitivity for detecting plasma-etch damage.

The sensitivity to plasma-etch effects of the plasma-etch effect test diode 108 is believed to result from generation and recombination currents generated at damage sites in the crystal lattice of the silicon substrate 102 and leakage currents occurring across the diode boundary by conductive contamination.

The plasma-etch effect test diode 108 is formed in the active device regions 106 using standard photolithographic techniques or "buried diffusion" techniques in which the diodes are formed prior to gate creation. For example, using a photolithographic technique, a photoresist mask 110 is formed overlying the thin oxide film 105 in the active device regions 106 and the field oxide regions 104. The photoresist mask 110 is patterned so that a large peripheral area 112 separates the lateral edges of the exposed region of the semiconductor wafer 100 from the field oxide regions 104. The plasma-etch effect test diode 108 is most effective when large peripheral edges are exposed during subsequent plasma-etch processing. The plasma-etch effect test diode 108 is implanted through heavily-doped ion implantation of an N+ type diode region 114. The heavily-doped N+ diode implant is formed by injecting arsenic atoms into the diode region 114 portion of the P-type substrate 102. The arsenic atoms are implanted at a dosage in the range of $1 \times 10^{15}$ to $5 \times 10^{15}$ atoms/cm$^2$ and an energy in the range of 2 to 50 keV to produce an arsenic concentration in the range of about $1 \times 10^{18}$ to $1 \times 10^{20}$ atoms/cm$^3$ and a junction depth in the range of 200 Å to 3000 Å.

Although the illustrative embodiment depicts an N+ type diode formed within a P type substrate, in other embodiments a P+ type diode may similarly be implanted into an N type substrate so that either N type or P type diodes may be used for characterizing plasma-etch effects. Although the illustrative embodiment depicts a diode that is formed by ion implantation, other embodiments utilize diodes that are formed by diffusion doping. Furthermore, although the illustrative embodiment depicts a diode that is formed by photolithographic doping techniques, in other embodiments the diode is formed by buried diffusion in general where a source/drain region is created prior to gate formation that is buried beneath the gate by gate creation.

Following the formation of the plasma-etch effect test diode 108, plasma-etching steps of the integrated circuit fabrication process are performed. The plasma-etch effect test diode 108 only characterizes plasma-etching damage that occurs in fabrication steps that follow formation of the plasma-etch effect test diode 108.

Figure 1D:
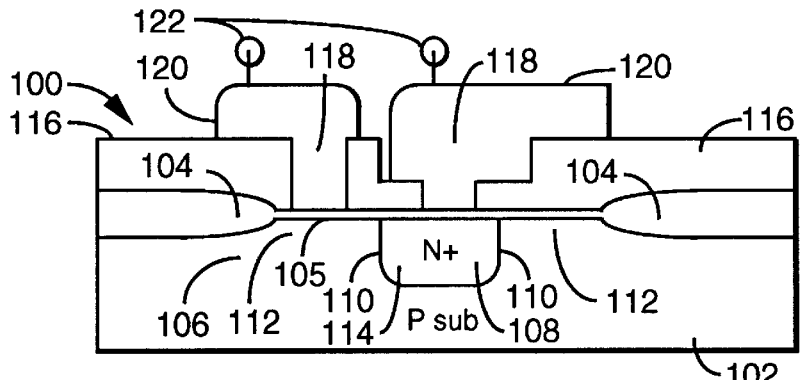

Referring to FIG. 1D, a dielectric layer 116 is formed overlying the surface of the semiconductor wafer 100, patterned and etched to isolate devices (not shown) in other areas of the semiconductor wafer 100. The dielectric layer 116 is patterned and etched in the vicinity of the plasma-etch effect test diode 108 to supply vias 118 for forming conductive interconnect structures 120 and test terminals 122 for performing electrical tests for characterizing plasma-etch damage. The conductive interconnect structures 120 may be deposited polysilicon but are more commonly formed from metal plugs such as titanium, tungsten, aluminum, molybdenum and the like Formation of the dielectric layer 116 and the conductive interconnect structures 120 are typically performed as general isolation and interconnect-forming steps of integrated circuit processing. Formation of the dielectric layer 116 and the conductive interconnect structures 120 may either precede or follow plasma etching steps that are subsequent to formation of the plasma-etch effect test diode 108. Although the illustrative embodiment supplies the conductive interconnect structures 120 and the test terminals 122 for accessing the plasma-etch effect test diode 108, in other test configuration embodiments a test probe may be applied to the plasma-etch effect test diode 108 directly.

The conductive interconnect structures 120 and test terminals 122 for accessing the plasma-etch effect test diode 108 are utilized for performing plasma-etch damage characterization tests. Electrical testing of the plasma-etch effect test diode 108 is performed by measuring electrical parameters from the test terminals 122. A diode can pass current in a forward bias direction and not in a reverse bias direction. Operation of the plasma-etch effect test diode 108 is tested by measuring the diode with proper polarities. As the voltage is increased in a forward direction, current immediately begins flowing across the P/N junction and out of the plasma-etch effect test diode 108. An initial resistance to the current flow arises from contact resistance and a small resistance at the junction Once the resistances are overcome, a full flow of current passes through the diode. A diode is designed to achieve a current-flow condition at some minimum "forward voltage". In the reverse direction, the plasma-etch effect test diode 108 is designed to block current flow as long as the voltage remains below a specified value. In the reverse condition, a small "leakage" current always flows across the junction. Increasing the voltage increases the leakage current to a level at which the junction breaks down, allowing "full" current flow. The voltage at which the junction breaks down is called the breakdown voltage. Circuits are designed to operate at a voltage below the designed breakdown voltage of the diode to exploit the blocking nature of the junction.

In the illustrative embodiment, the leakage current is measured to assess plasma-etch damage. The measurement of diode leakage current through the plasma-etch effect test diode 108 which is formed completely within the active device region 106, removed from the field oxide regions 104 quantifies the extent of damage created by a plasma and the effectiveness of a repair technique that may be applied to the process.

The plasma-etch effect test diode 108 is a simple device including simple fabrication and testing procedures. The process steps for fabricating the plasma-etch effect test diode 108 are similar to the process steps for fabricating devices on an operational integrated circuit so that test structures are formed with minimal mask and process adjustments. The steps for fabricating the plasma-etch effect test diode 108 are fully integrated into a standard CMOS process flow with few additional steps. The plasma-etch effect test diode 108 provides plasma-etch damage characterization that has been found to be much more sensitive than conventional techniques.

Figure 3:
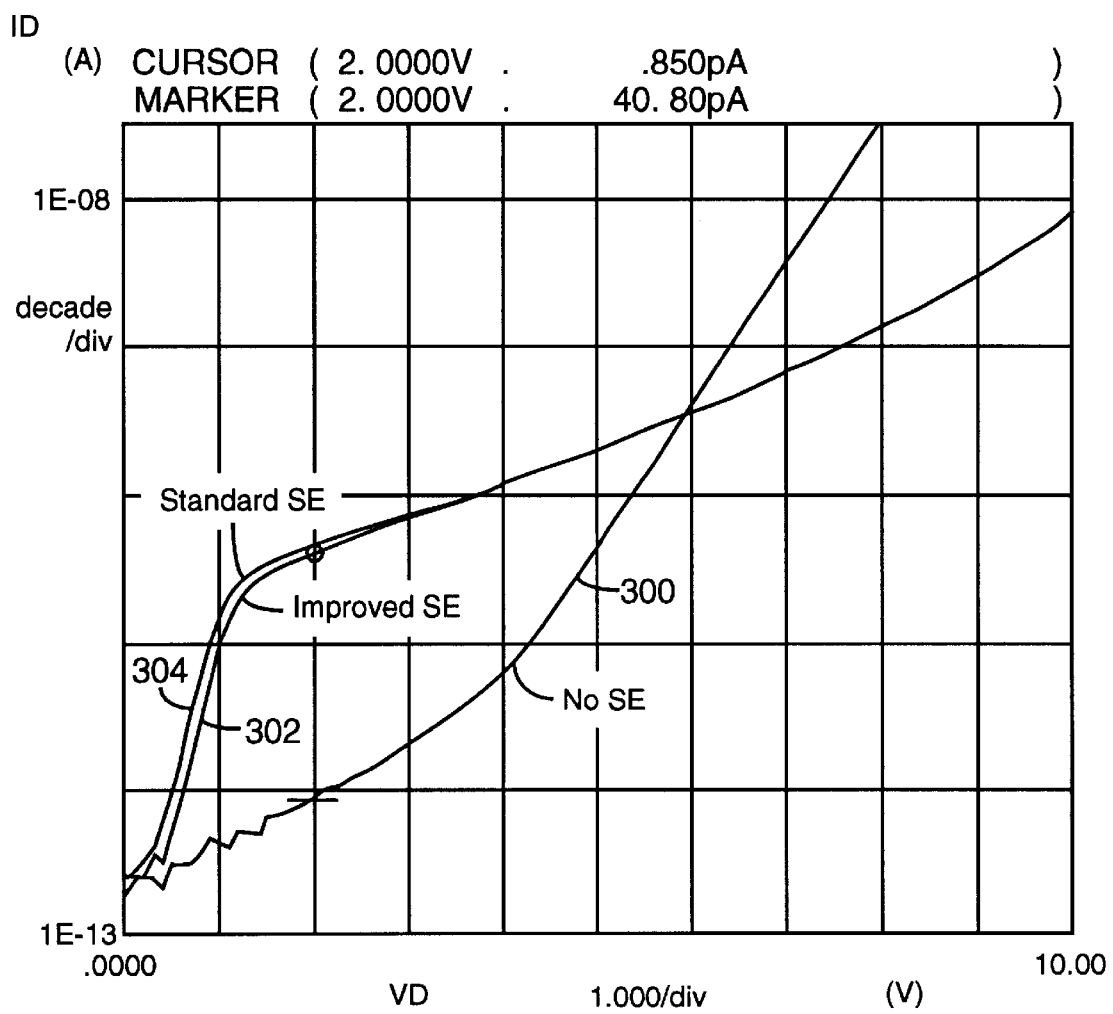
FIG. 3 is a graph illustrating an increase in diode leakage current that results from plasma-etch processing.
Figure 4:
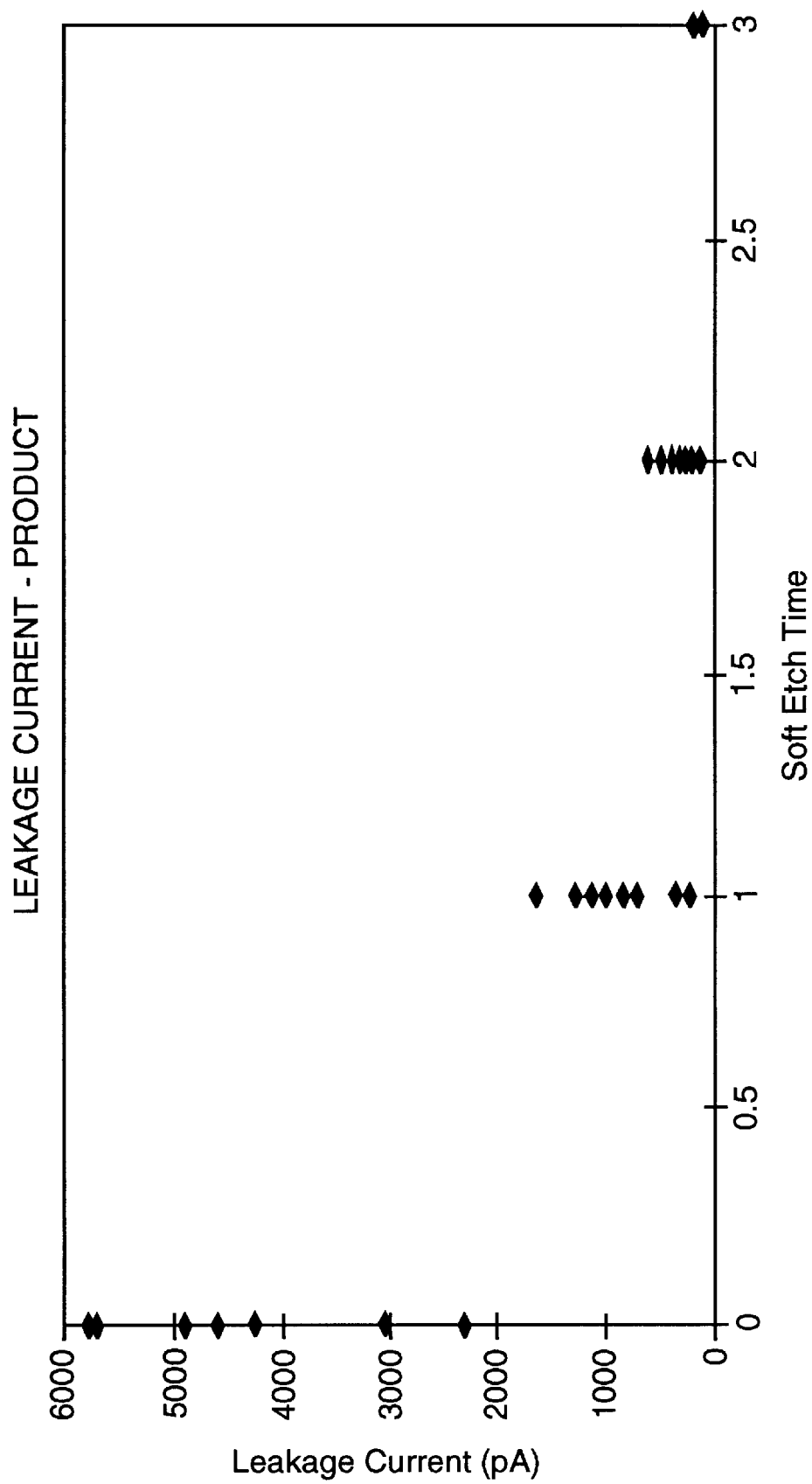
FIG. 4 is a graph that illustrates the utility of a processing for repairing plasma-etch damage.

Referring to FIG. 3, a graph illustrates an increase in diode leakage current that results from plasma-etch processing. The graph depicts diode leakage current on the y-axis as a function of diode voltage on the x-axis. Curves 302 and 304 show a high leakage current that results from plasma-etch processing. Curve 300 depicts a diode that is not processed using a plasma etch process. The magnitude of diode leakage current is increased by two orders of magnitude for the diodes 302 and 304 that are subjected to plasma etch processing Referring to FIG. 4, a graph illustrates the utility of a processing for repairing plasma-etch damage. The illustrative technique for characterizing plasma-etch damage is useful for determining the effectiveness of damage repair procedures. The illustrative technique is also useful for determining process parameters for the repair process. The graph depicts diode leakage current on the y-axis as a function of application time for a repair process on the x-axis for multiple tested diodes. The graph shows that two units of repair time substantially improve the diode leakage in comparison to one unit of repair time. The diode leakage test using the plasma-etch effect test diode 108 assists in characterizing the optimal method and process application time for a repair process.

While the invention has been described with reference to various embodiments, it will be understood that these embodiments are illustrative and that the scope of the invention is not limited to them. Many variations, modifications, additions and improvements of the embodiments described are possible. For example, those skilled in the art will readily implement the steps necessary to provide the structures and methods disclosed herein, and will understand that the process parameters, materials, and dimensions are given by way of example only and can be varied to achieve the desired structure as well as modifications which are within the scope of the invention. Variations and modifications of the embodiments disclosed herein may be made based on the description set forth herein, without departing from the scope and spirit of the invention as set forth in the following claims.

What is claimed is:

1. A technique for detecting and characterizing plasma-etch induced damage in an integrated circuit comprising:

forming a plasma-etch effect test diode in a semiconductor substrate having a substrate conductivity, the semiconductor substrate having a silicon dioxide layer overlying the semiconductor substrate, the silicon dioxide layer having a thin silicon dioxide portion overlying an active device region of the semiconductor substrate and a thick field oxide layer in a field region, and the plasma-etch effect test diode having a conductivity opposite to the substrate conductivity doped into a diode region within the active device region of the semiconductor substrate, the diode region being fully contained within the active device region and removed from the thick field oxide layer in the field region;

after plasma etching over an area of the semiconductor substrate, applying a reverse voltage across the diode with a first test terminal contacting the thin silicon dioxide layer completely overlying the diode region and a second test terminal contacting the thin silicon dioxide layer overlying the active device region outside the doped diode region, the reverse voltage being less than a breakdown voltage; and measuring a leakage current through the diode.

2. A technique according to claim 1, wherein:

the diode has a heavily-doped N+ type conductivity; and the semiconductor substrate has a lightly-doped P type conductivity.

3. A technique according to claim 1, wherein:

the diode has a heavily-doped P+ type conductivity; and the semiconductor substrate has a lightly-doped N type conductivity.

4. A technique according to claim 1, wherein:

the diode is formed within the semiconductor substrate by photolithographic patterning and doping into the diode region of the active device region.

5. A technique according to claim 1, wherein:

the diode is formed within the semiconductor substrate by buried diffusion in which a first conductive diffusion is doped into an opposite-type substrate in a source/drain doping that is buried under a gate on formation of the gate.

6. A technique according to claim 1, further comprising:

performing a plasma-etch induced damage repair process based on the measured leakage current through the diode.

7. A technique according to claim 1, further comprising:

performing a plasma-etch induced damage repair process based on a result of the measured leakage current through the diode; and assessing success or failure of the plasma-etch induced damage repair process by measuring a subsequent leakage current through the diode.

8. A technique according to claim 1, further comprising:

using the measured leakage current through the diode to assess plasma-etch induced damage.

9. A technique according to claim 1, further comprises:

modifying the polarity and amplitude of the reverse voltage; and measuring current in response to a plurality of polarities and amplitudes of the reverse voltage.

10. A technique according to claim 1, further comprising:

quantifying a damage extent created by a plasma-etch process based on the measured diode leakage current.

11. A technique according to claim 1, further comprising:

determining an effectiveness of a repair technique applied to the integrated circuit to repair damage created by the plasma-etch process.

12. A method of testing an integrated circuit comprising:

fabricating a plasma-etch effect test diode including:

providing a semiconductor substrate having a substrate conductivity;

forming a silicon dioxide layer overlying the semiconductor substrate, the silicon dioxide layer having a thin silicon dioxide portion overlying an active device region of the semiconductor substrate and a thick field oxide layer in a field region; and doping a diode region within the active device region of the semiconductor substrate with a conductivity opposite to the substrate conductivity, the diode region being fully contained within the active device region and removed from the thick field oxide layer in the field region; and detecting and characterizing plasma-etch induced damage in an integrated circuit including:

after plasma etching over an area of the semiconductor substrate, applying a reverse voltage across the diode with a first test terminal contacting the thin silicon dioxide layer completely overlying the diode region and a second test terminal contacting the thin silicon dioxide layer overlying the active device region outside the doped diode region, the reverse voltage being less than a breakdown voltage; and measuring a leakage current through the diode.

13. A method according to claim 12, further comprising:

modifying the polarity and amplitude of the reverse voltage; and measuring current in response to a plurality of polarities and amplitudes of the reverse voltage.

14. A method according to claim 12, further comprising:

quantifying a damage extent based on the measured diode leakage current.

15. A method according to claim 14, further comprising:

determining an effectiveness of a repair technique applied to the integrated circuit to repair damage created by the plasma-etch process.

16. A method of testing an integrated circuit comprising:

providing a plasma-etch effect test diode formed in a semiconductor substrate having an active device region and a field region, the semiconductor substrate having a substrate conductivity, the plasma-etch effect test diode including:

a silicon dioxide layer overlying the semiconductor substrate, the silicon dioxide layer having a thin silicon dioxide portion overlying the active device region of the semiconductor substrate and a thick field oxide layer in the field region; and a diode region formed within the active device region, the diode region having a conductivity opposite to the substrate conductivity, the diode region being fully contained within the active device region and removed from the thick field oxide layer in the field region; and detecting and characterizing plasma-etch induced damage in an integrated circuit including:

after plasma etching over an area of the semiconductor substrate, applying a reverse voltage across the diode with a first test terminal contacting the thin silicon dioxide layer completely overlying the diode region and a second test terminal contacting the thin silicon dioxide layer overlying the active device region outside the doped diode region, the reverse voltage being less than a breakdown voltage; and measuring a leakage current through the diode.

17. A method according to claim 16, further comprising:

modifying the polarity and amplitude of the reverse voltage; and measuring current in response to a plurality of polarities and amplitudes of the reverse voltage.

18. A method according to claim 16, further comprising:

quantifying a damage extent created by a plasma-etch process based on the measured diode leakage current.

19. A method according to claim 18, further comprising:

determining an effectiveness of a repair technique applied to the integrated circuit to repair damage created by the plasma-etch process.

* * * * *